United States Patent
Onuma et al.

(10) Patent No.: US 11,329,033 B2
(45) Date of Patent: May 10, 2022

(54) SEMICONDUCTOR MODULE, DISPLAY DEVICE, AND SEMICONDUCTOR MODULE PRODUCTION METHOD

(71) Applicant: SHARP KABUSHIKI KAISHA, Sakai (JP)

(72) Inventors: Hiroaki Onuma, Sakai (JP); Hiroyoshi Higashisaka, Sakai (JP); Tsuyoshi Ono, Sakai (JP); Takashi Ono, Sakai (JP); Takashi Kurisu, Sakai (JP); Yuhsuke Fujita, Sakai (JP); Toshio Hata, Sakai (JP); Katsuji Iguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 9 days.

(21) Appl. No.: 16/760,249

(22) PCT Filed: Feb. 21, 2018

(86) PCT No.: PCT/JP2018/006103
§ 371 (c)(1),
(2) Date: Apr. 29, 2020

(87) PCT Pub. No.: WO2019/092893
PCT Pub. Date: May 16, 2019

(65) Prior Publication Data
US 2020/0357781 A1 Nov. 12, 2020

(30) Foreign Application Priority Data
Nov. 10, 2017 (JP) .............. JP2017-217541

(51) Int. Cl.
*H01L 25/16* (2006.01)
*H01L 25/00* (2006.01)
(Continued)

(52) U.S. Cl.
CPC ............ *H01L 25/167* (2013.01); *H01L 25/50* (2013.01); *H01L 33/0093* (2020.05); *H01L 33/50* (2013.01)

(58) Field of Classification Search
None
See application file for complete search history.

(56) References Cited

U.S. PATENT DOCUMENTS

| 2013/0009172 A1* | 1/2013 | Kusunoki ........... H01L 33/0093 257/79 |
|---|---|---|
| 2017/0069611 A1 | 3/2017 | Zhang et al. |

(Continued)

FOREIGN PATENT DOCUMENTS

| JP | 2015-126209 A | 7/2015 |
| JP | 2016-115703 A | 6/2016 |

(Continued)

Primary Examiner — Robert K Carpenter
(74) Attorney, Agent, or Firm — ScienBiziP, P.C.

(57) ABSTRACT

A semiconductor module includes a base substrate; a plurality of light emitting elements; a plurality of color conversion layers being in contact with each upper portion of the plurality of light emitting elements adjacent to each other; and a light shielding layer disposed between the plurality of light emitting elements adjacent each other and between the color conversion layers adjacent to each other, and separating the plurality of light emitting elements and a plurality of color conversion layers.

16 Claims, 8 Drawing Sheets

(51) Int. Cl.
   *H01L 33/00*     (2010.01)
   *H01L 33/50*     (2010.01)

(56)            References Cited

U.S. PATENT DOCUMENTS

2017/0154880 A1    6/2017  Ozeki et al.
2017/0263828 A1*   9/2017  Mao .................. H01L 33/62
2017/0365755 A1*  12/2017  Chu .................. H01L 33/36
2019/0244941 A1    8/2019  Zhang et al.

FOREIGN PATENT DOCUMENTS

JP       2017-108092 A    6/2017
TW          201721833 A    6/2017

* cited by examiner

| 2: SEMICONDUCTOR MODULE | 21: METAL TERMINAL |
| 11: BASE SUBSTRATE | 22: INSULATING LAYER |
| 14: ELECTRODE | 23: DUMMY ELEMENT |
| 15: LIGHT EMITTING ELEMENT | 31a, 32a: COLOR CONVERSION LAYER |
| 16b: LIGHT SHIELDING LAYER | |

3: SEMICONDUCTOR MODULE
11: BASE SUBSTRATE
14: ELECTRODE
15: LIGHT EMITTING ELEMENT
16b: LIGHT SHIELDING LAYER
21: METAL TERMINAL
22: INSULATING LAYER
23: DUMMY ELEMENT
31, 32: COLOR CONVERSION LAYER
33: TRANSPARENT RESIN LAYER

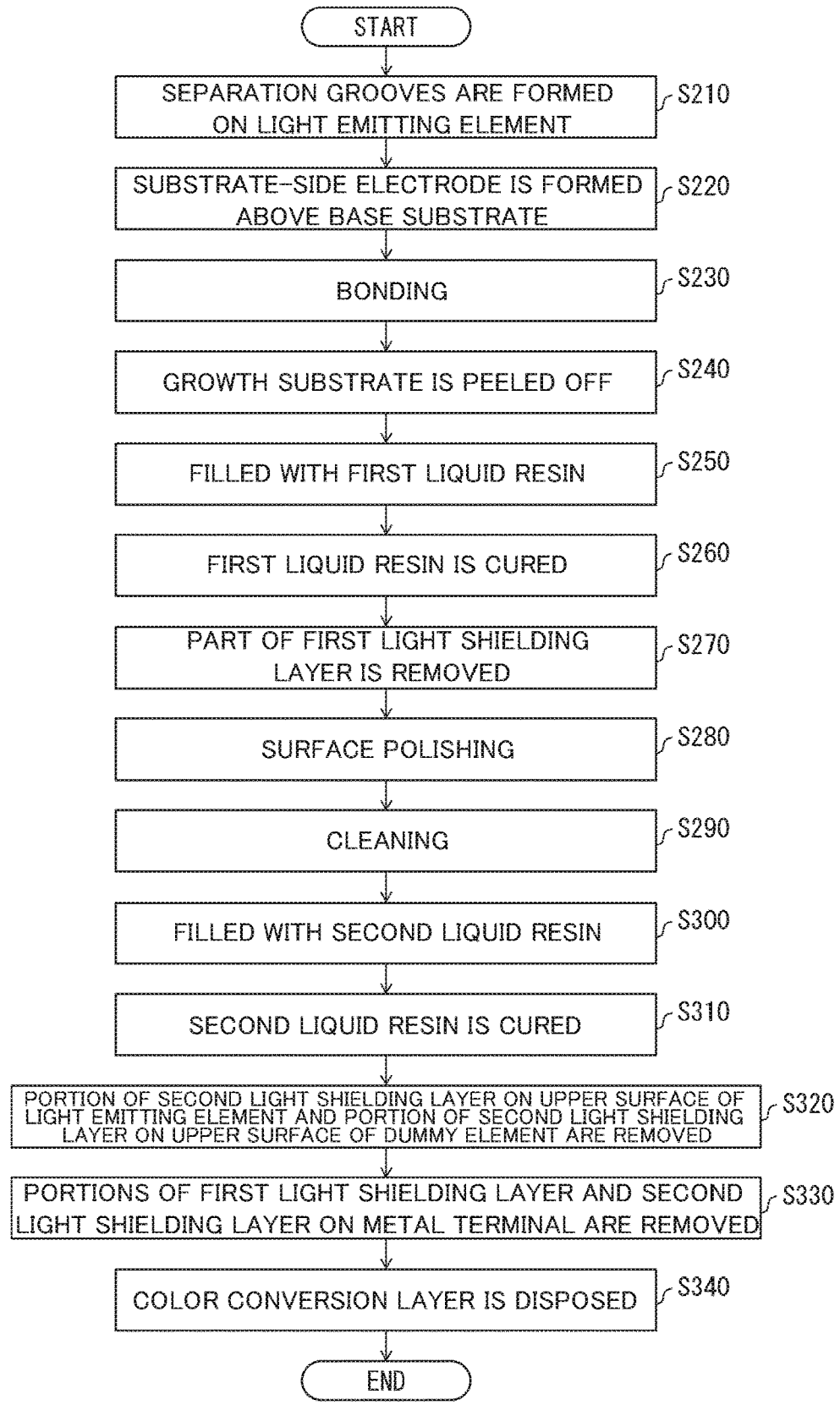

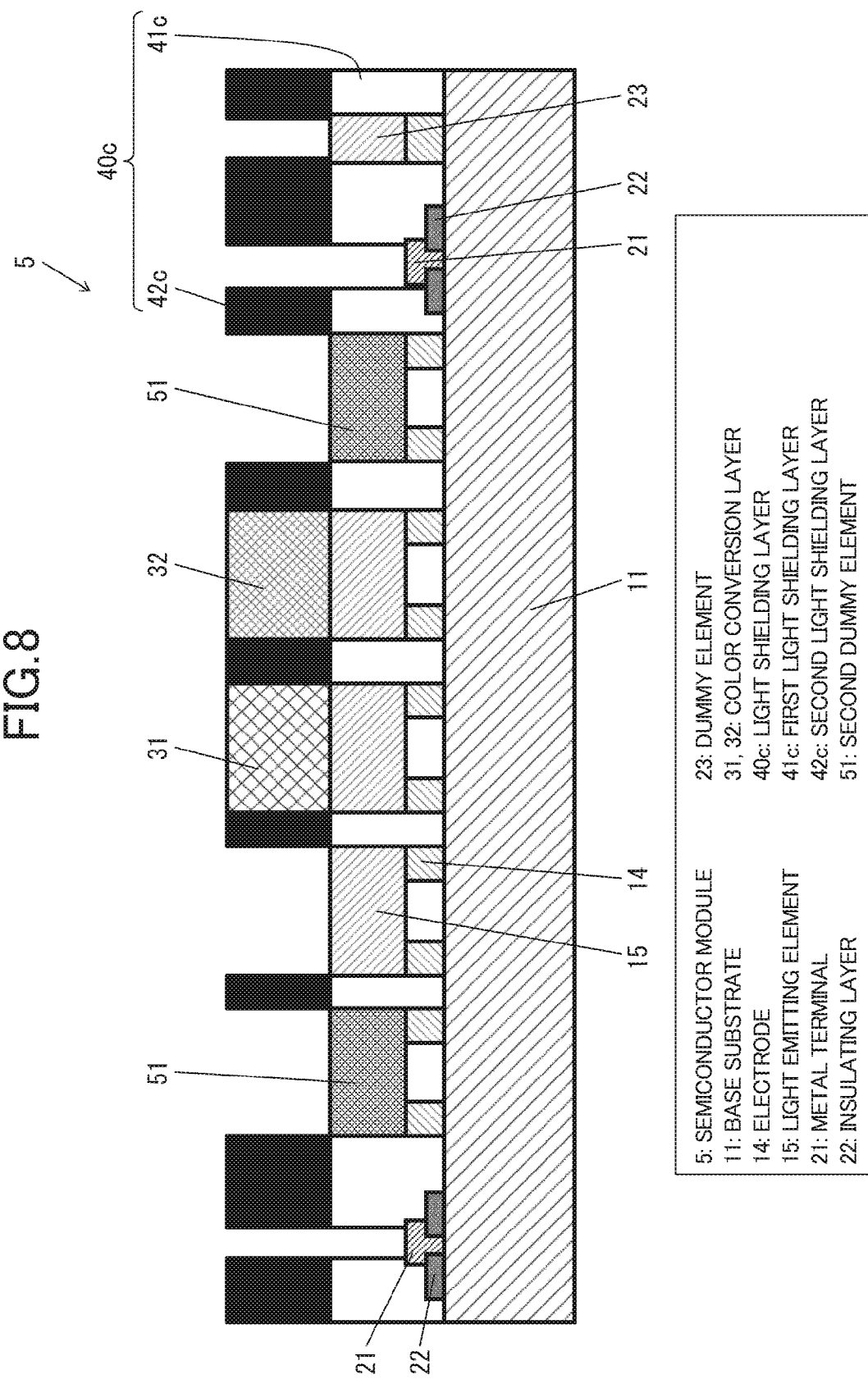

SEMICONDUCTOR MODULE, DISPLAY DEVICE, AND SEMICONDUCTOR MODULE PRODUCTION METHOD

TECHNICAL FIELD

The present invention relates to a semiconductor module, a display device, and a semiconductor module production method.

BACKGROUND ART

PTL 1 discloses a light emitting device including a base, and a first light emitting element and a second light emitting element disposed on the base. The light emitting device further includes a light transmitting member provided on an upper surface of the first light emitting element, a wavelength conversion member provided on an upper surface of the second light emitting element, and a light shielding member covering the first light emitting element, the second light emitting element, the light transmitting member, and a side surface of the wavelength conversion member.

CITATION LIST

Patent Literature

PTL 1: Japanese Unexamined Patent Application Publication No 2015-126209 (published on Jul. 6, 2015)

SUMMARY OF INVENTION

Technical Problem

In the light emitting device disclosed in PTL 1, a light emitting element and a light transmitting member are connected by a known method such as pressure bonding, sintering, or bonding with an adhesive, and an adhesive layer is formed between the light emitting element and the light transmitting member. Therefore, there is a problem that light extraction efficiency is reduced.

An object of an aspect of the present invention is to make light emitted from each light emitting element emphasize and to improve the light extraction efficiency of light emitted from the light emitting element.

Solution to Problem

In order to solve the problem described above, a semiconductor module according to an aspect of the present invention includes a base substrate in which a drive circuit is formed; a plurality of light emitting elements electrically connected to the drive circuit; a plurality of color conversion layers being in contact with an upper portion of each of the plurality of light emitting elements adjacent to each other; and a light shielding layer disposed between the light emitting elements adjacent to each other and between the color conversion layers adjacent to each other, and separating the plurality of the light emitting elements and the plurality of color conversion layers.

A semiconductor module according to an aspect of the present invention includes a base substrate in which a drive circuit is formed; a plurality of light emitting elements electrically connected to the drive circuit; a light shielding layer disposed between the light emitting elements adjacent to each other and separating the plurality of light emitting elements; a metal terminal provided on the base substrate and supplying electric power from outside to drive the drive circuit; and an insulating layer provided on the base substrate and covering a part of an upper surface of the base substrate. The metal terminal penetrates the insulating layer and is in contact with a pad electrode formed on the upper surface of the base substrate. A part of the metal terminal is in contact with an upper surface of the insulating layer.

A semiconductor module production method according to an aspect of the present invention includes a step of forming a plurality of light emitting elements from a semiconductor layer grown on a growth substrate; a step of peeling the growth substrate from the plurality of light emitting elements by laser irradiation; a step of laying a light shielding layer on the base substrate so as to cover an upper surface of the base substrate and an entirely exposed surface of the light emitting element, after the step of peeling the growth substrate; a step of removing a portion of the light shielding layer on an upper surface of the light emitting element, after the step of filling the light shielding layer; and a step of forming a color conversion layer on an upper portion of the light emitting element. The plurality of light emitting elements are electrically connected to a drive circuit formed in the base substrate.

A semiconductor module production method according to an aspect of the present invention includes a step of forming a plurality of light emitting elements from a semiconductor layer grown on a growth substrate; a step of peeling the growth substrate from the plurality of light emitting elements by laser irradiation; a step of laying a first light shielding layer on the base substrate so as to cover an upper surface of the base substrate and an entirely exposed surface of the light emitting element, after the step of peeling the growth substrate; a step of removing a portion of the first light shielding layer above a height of an upper surface of the light emitting element from the base substrate, after the step of filling the first light shielding layer; a step of forming a second light shielding layer made of a material different from a material of the first light shielding layer, on an upper portion of the first light shielding layer, after the step of removing the portion of the first light shielding layer; a step of removing a portion of the second light shielding layer on the upper surface of the light emitting element, after the step of forming the second light shielding layer; and a step of forming a color conversion layer on an upper portion of the light emitting element. The plurality of light emitting elements are electrically connected to a drive circuit formed in the base substrate.

A semiconductor module production method according to an aspect of the present invention includes a step of forming a plurality of light emitting elements from a semiconductor layer grown on a growth substrate; a step of peeling the growth substrate from the plurality of light emitting elements by laser irradiation; a step of laying a light shielding layer on the base substrate, so as to cover an upper surface of the base substrate, an entirely exposed surface of the light emitting element, and a metal terminal, after the step of peeling the growth substrate; and a step of removing a portion of the light shielding layer on an upper surface of the light emitting element and a portion of the light shielding layer on the metal terminal, after the step of filling the light shielding layer. The plurality of light emitting elements are electrically connected to a drive circuit formed in the base substrate. The metal terminal is provided on the base substrate, and supplies electric power from outside to drive the drive circuit.

Advantageous Effects of Invention

According to an aspect of the present invention, light emitted from each light emitting element is emphasized and the light extraction efficiency of the light emitted from the light emitting element can be improved.

BRIEF DESCRIPTION OF DRAWINGS

FIG. 7 is a flowchart illustrating the production method of the semiconductor module according to Embodiment 4 of the present invention.

FIG. 8 is a sectional view illustrating a configuration of a semiconductor module according to Embodiment 5 of the present invention.

DESCRIPTION OF EMBODIMENTS

Embodiment 1

Figure 1:
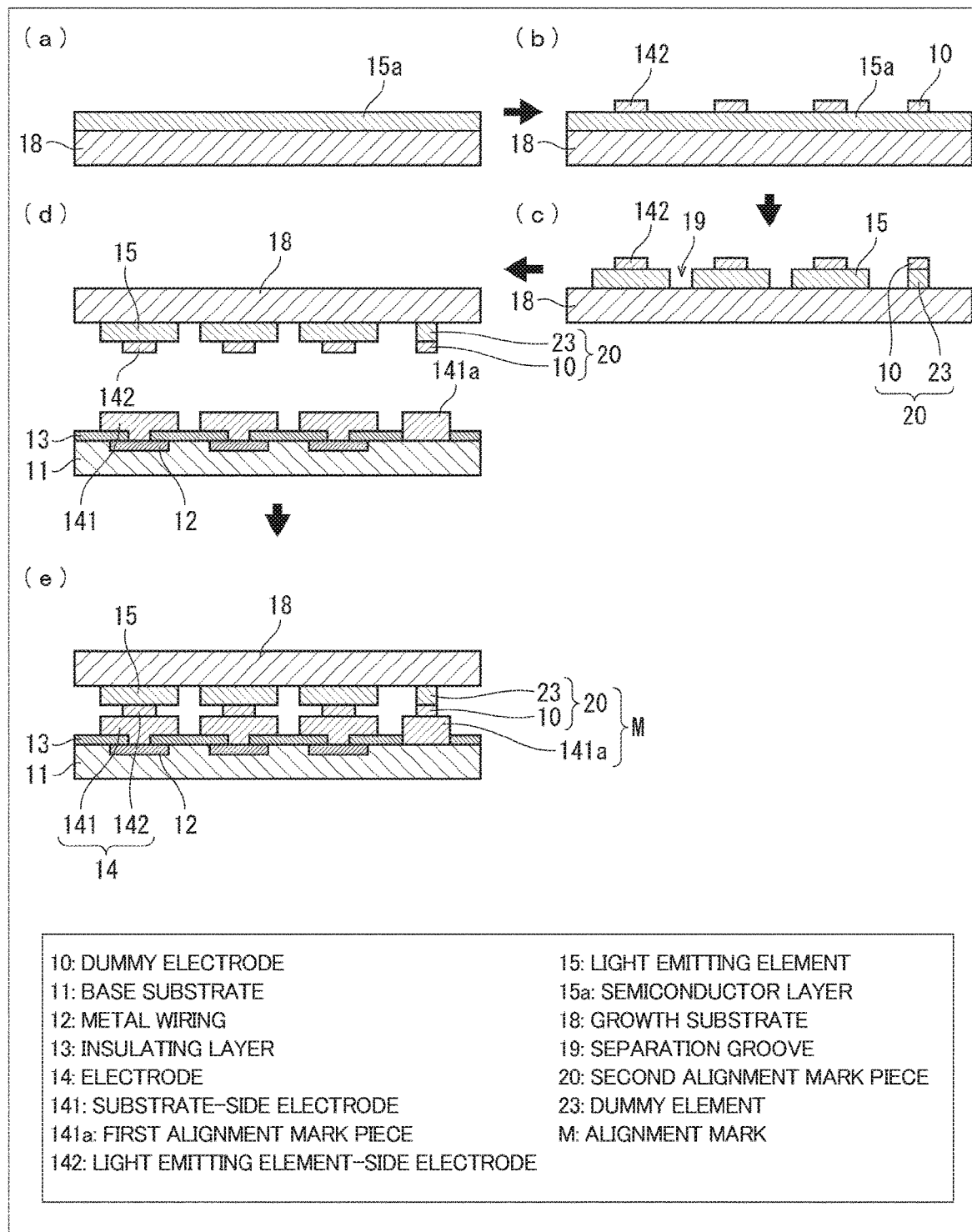
FIG. 1 is a view illustrating a production method of a semiconductor module according to Embodiment 1 of the present invention.
Figure 2:
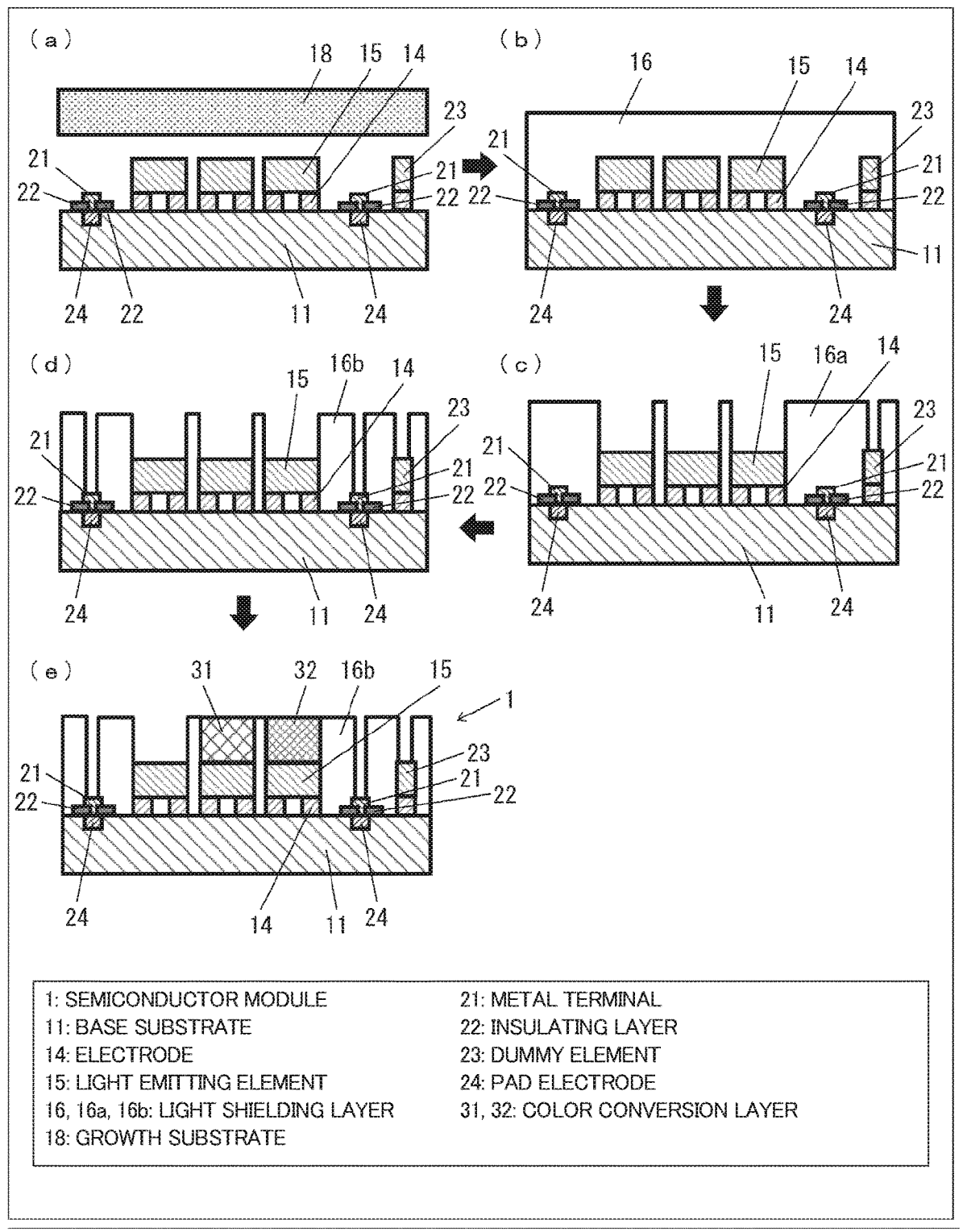
FIG. 2 is a view illustrating the production method of the semiconductor module according to Embodiment 1 of the present invention.
Figure 3:
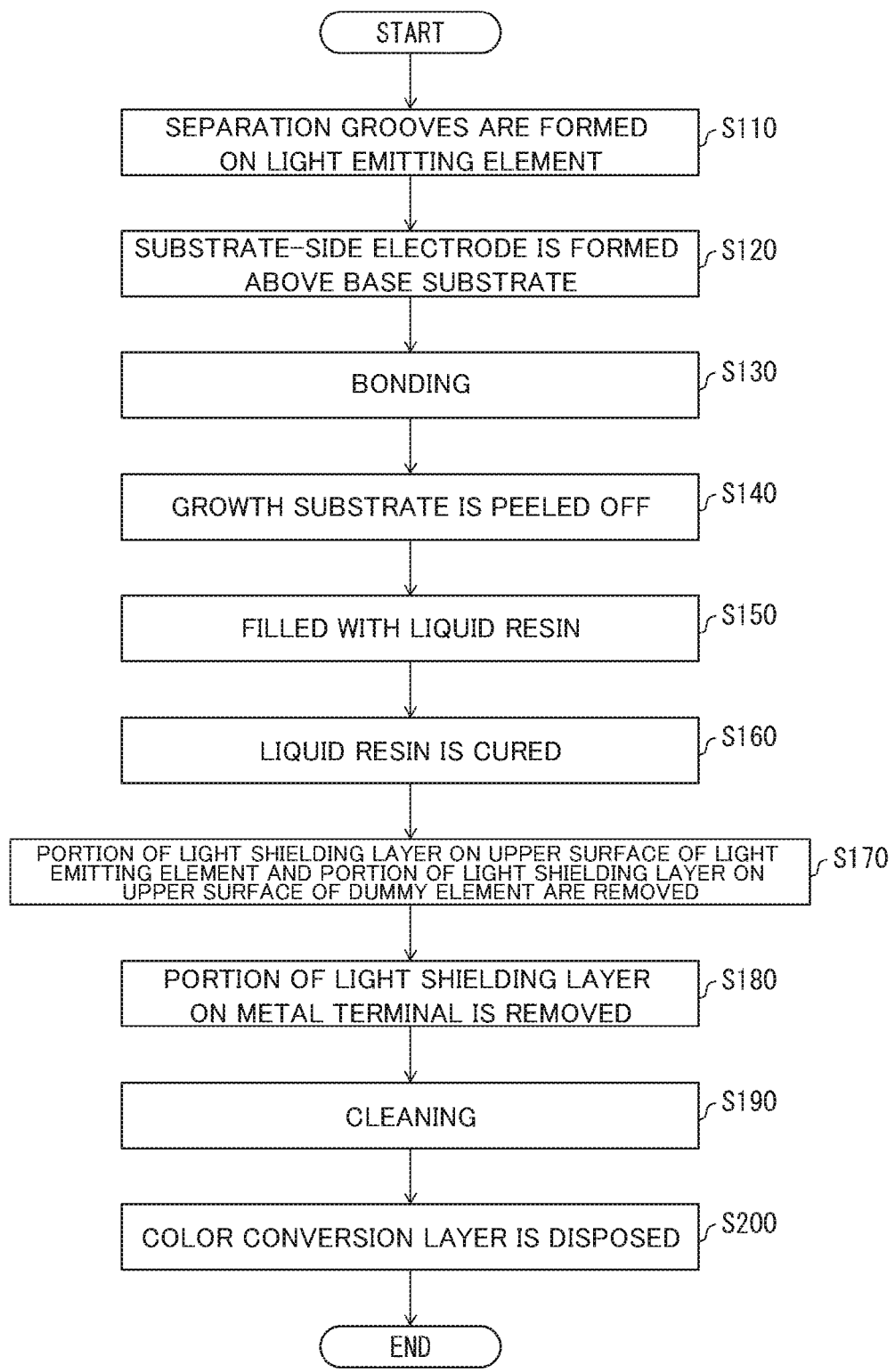
FIG. 3 is a flowchart illustrating the production method of the semiconductor module according to Embodiment 1 of the present invention.

FIGS. 1 and 2 are views illustrating a production method of a semiconductor module 1 according to Embodiment 1 of the present invention. FIG. 3 is a flowchart illustrating the production method of the semiconductor module 1 according to Embodiment 1 of the present invention. A configuration and the production method of the semiconductor module 1 will be described with reference to FIGS. 1, 2, and 3. FIG. 2 is a simplified view of a part of the configuration of the semiconductor module 1 illustrated in FIG. 1, in which metal wiring 12 and an insulating layer 13 are omitted, and a substrate-side electrode 141 and a light emitting element side electrode 142 are displayed as an electrode 14. A display device that includes the semiconductor module 1 and displays an image is also included in the technical scope of the present invention.

(Configuration of Semiconductor Module 1)

As illustrated in FIG. 2(e), the semiconductor module 1 includes a base substrate 11, the electrode 14, a light emitting element 15, a light shielding layer 16b, a metal terminal 21, an insulating layer 22, a dummy element 23, a pad electrode 24, and color conversion layers 31 and 32. In the semiconductor module 1, a plurality of light emitting elements 15 are actually provided on the base substrate 11 via the electrode 14. However, FIGS. 1 and 2 are described in which three light emitting elements 15 are provided on the base substrate 11 via the electrode 14.

(Base Substrate 11)

As the base substrate 11, a substrate formed with wiring can be used, so that at least a surface thereof can be connected to the light emitting element 15. A drive circuit for driving the light emitting element 15 is formed in the base substrate 11. As the material of the base substrate 11, a crystalline substrate such as a single crystal or polycrystal of aluminum nitride composed entirely of aluminum nitride, and a sintered substrate are preferably used. In addition, the material of the base substrate 11 is preferably a ceramic substrate such as alumina, a glass substrate, a semi-metal substrate such as Si, or a metal substrate. In addition, a laminate or a composite such as a substrate having an aluminum nitride thin film layer formed on the surface thereof can be used. Since the metal substrate and the ceramic substrate have high heat dissipation, they are preferable as the material of the base substrate 11.

For example, a high-resolution display device in which fine light emitting elements 15 are densely packed can be produced by using as the base substrate 11, a drive circuit for controlling light emission of the light emitting elements 15 formed on Si by an integrated circuit forming technique.

(Metal Wiring 12)

The metal wiring 12 is wiring including at least a control circuit that supplies a control voltage to the light emitting element 15. The metal wiring 12 is formed by patterning a metal layer by an ion milling method, an etching method, or the like. For example, there is an example in which the metal wiring 12 made of a platinum thin film or the like is formed on the surface of the Si substrate. Further, for the purpose of protecting the metal wiring 12, a protective film made of a thin film such as $SiO_2$ may be formed on the surface of the base substrate 11 on a side where the metal wiring 12 is formed.

(Insulating Layer 13)

The insulating layer 13 is an insulating layer including an oxide film, a resin film, and a resin layer. The insulating layer 13 prevents the base substrate 11 and the electrode 14 from being in direct contact with each other.

(Electrode 14)

The electrode 14 electrically connects the metal wiring 12 and a metal terminal (not illustrated) provided on the light emitting element 15, and is also called a bump. As illustrated in FIG. 1(e), a first portion of the electrode 14 connected to the metal wiring 12 is the substrate-side electrode 141, and a second portion of the electrode 14 connected to the metal terminal (not illustrated) provided on the light emitting element 15 is the light emitting element-side electrode 142. The substrate-side electrode 141 and the light emitting element-side electrode 142 are made of, for example, any one of Au, Pt, Pd, Rh, Ni, W, Mo, Cr, and Ti, an alloy thereof, or a combination thereof. As an example of the combination, when the substrate-side electrode 141 and the light emitting element-side electrode 142 are configured as metal electrode layers, a laminated structure of W/Pt/Au, Rh/Pt/Au, W/Pt/Au/Ni, Pt/Au, Ti/Pt/Au, Ti/Rh, or TiW/Au from a lower surface is conceivable. The light emitting element-side electrode 142 can be a flip chip type in which an n-side electrode and a p-side electrode are formed on a same surface side, and are disposed on a side opposite to a light emitting surface of the light emitting element 15.

The electrode 14 has a step portion in a light emission direction. A cross-sectional area of the substrate-side electrode 141 parallel to the light emission direction is different from a cross-sectional area of the light emitting element-side electrode 142 parallel to the light emission direction. In FIG. 1(e), the cross-sectional area of the substrate-side electrode 141 is larger than the cross-sectional area of the light emitting element-side electrode 142. An outermost surfaces of the substrate-side electrode 141 and the light emitting element-side electrode 142 are preferably made of Au.

(Light Emitting Element 15)

As the light emitting element 15, a known light emitting element, specifically, a semiconductor light emitting element can be used. For example, there is GaAs-based, ZnO-based, or GaN-based one. As the light emitting element 15, a light emitting diode (LED) that emits red, yellow, green, blue, or violet light may be used, or an LED that emits ultraviolet light may be used. Among them, it is preferable to use a GaN-based semiconductor capable of emitting blue to violet light or violet to ultraviolet light as the light emitting element 15. Here, the light emitting element 15 emits blue light. The light emitting element 15 emits light from an upper surface in FIG. 2(*e*). The upper surface of the light emitting element 15 is a light emitting surface. The light emitting element 15 is electrically connected to the drive circuit formed in the base substrate 11 via the electrode 14. By disposing the color conversion layers 31 and 32, which exhibit light emitting colors different from the light emitting color of the light emitting element 15 when the light is emitted, various light emitting colors in the visible light region can be exhibited on the upper portion of the light emitting element 15. Therefore, it is possible to emit short-wavelength light that can be efficiently excited. Further, the GaN-based semiconductor is preferable for the light emitting element 15 in that it has features of high luminous efficiency, long life, and high reliability.

As the semiconductor layer of the light emitting element 15, the nitride semiconductor is preferably used in the semiconductor module 1 in which the nitride semiconductor is in a short wavelength region of the visible light region, a near ultraviolet region, or a shorter wavelength region shorter than that, and a combination of light emitting element and wavelength conversion member (phosphor), showing high conversion efficiency with short wavelength, to convert emission color. The semiconductor is not limited thereto, and may be a semiconductor such as a ZnSe-based, InGaAs-based, or AlInGaP-based semiconductor.

The light emitting element structure by a semiconductor layer preferably has a structure having an active layer between the first conductivity type (n-type) layer and the second conductivity type (p-type) layer in terms of output efficiency, but is not limited thereto. In addition, a structure may be provided in which each conductivity type layer is partially provided with an insulating, semi-insulating, and reverse conductivity type structure, or they are additionally provided to the first and second conductivity type layers. It may additionally have another circuit structure, for example, a protection element structure.

In the present embodiment, the growth substrate 18 is peeled off by laser light irradiation or the like, as described later. When the semiconductor module 1 is applied to a display device and the growth substrate 18 is provided on the light emitting element 15, light emitted from the light emitting element 15 is diffused in the growth substrate 18, and it is difficult to perform high-definition display. On the other hand, when the growth substrate 18 is not provided on the light emitting element 15, light emitted from each light emitting element 15 is extracted without being diffused, so that the display device can perform high-definition display.

Examples of the structure of the light emitting element 15 and the semiconductor layer thereof include a homo structure having a PN junction, a hetero structure, and a double hetero structure. Further, each layer may have a superlattice structure, or a single quantum well structure or a multiple quantum well structure in which a light emitting layer as an active layer is formed on a thin film in which a quantum effect occurs. A distance between the light emitting elements 15 is preferably 0.1 μm or more and 20 μm or less when viewed in a top view. As a result, when the growth substrate 18 is peeled off, an intensity of the laser light reaching the base substrate 11 when irradiating the laser light is low. For this reason, it is possible to reduce damage to the base substrate 11 caused when the growth substrate 18 is peeled off. Therefore, damage to the base substrate 11 having the drive circuit for driving the light emitting elements 15 can be reduced in a step of peeling the growth substrate 18 or the like.

In addition, when the distance between the light emitting elements 15 is 0.1 μm or more and 20 μm or less when viewed in a top view, a thickness of a portion of the light shielding layer 16*b* between the light emitting elements 15 is 0.1 μm or more and 20 μm or less. This thickness is a thickness along a direction in which the light emitting elements 15 are disposed.

(Light Shielding Layer 16*b*)

The light shielding layer 16*b* fixes the electrode 14, the light emitting element 15, the metal terminal 21, the insulating layer 22, and the color conversion layers 31 and 32 to the base substrate 11, and also prevents light from leaking from the light emitting element 15 and the side surfaces of color conversion layers 31 and 32. The light shielding layer 16*b* is disposed between the light emitting elements 15 adjacent to each other and between the color conversion layer 31 and the color conversion layer 32 adjacent to each other, and separates the plurality of light emitting elements 15, and the color conversion layers 31 and 32. The light shielding layer 16*b* covers a periphery of the color conversion layers 31 and 32 when viewed in a top view. The light shielding layer 16*b* is also called an underfill, and can be formed by curing a liquid resin as an example. The light shielding layer 16*b* covers the upper surface of the base substrate 11, the side surface of the electrode 14, the side surface of the light emitting element 15, the metal terminal 21, the insulating layer 22, the dummy element 23, and the side surfaces of the color conversion layers 31 and 32.

The light shielding layer 16*b* can protect the base substrate 11 and reduce damage to the base substrate 11 in the step of peeling the growth substrate 18 by reflection or absorption of laser light. Light emitted from the light emitting element 15 is emitted from a light emitting surface of the light emitting element 15 on a side opposite to the base substrate 11 side. Therefore, by covering the side surface of the light emitting element 15 with the light shielding layer 16*b*, the following operations and effects can be obtained. First, light can be prevented from leaking from the side surface of the light emitting element 15. Second, compared to the light emitted from the light emitting surface of the light emitting element 15, light having a color difference that is not negligible is suppressed to be emitted outward from the side surface. Therefore, an occurrence of unevenness of the color in an entirely light emitting color can be reduced. Third, the light traveling in a side surface direction is reflected toward a light extraction direction of the semiconductor module 1, and a light emitting region to the outside is further restricted. Thereby, a directivity of the emitted light can be increased, and the light emission luminance on the light emitting surface of the light emitting element 15 can be increased. Fourth, by conducting heat generated from the light emitting element 15 to the light shielding layer 16*b*, heat dissipation of the light emitting element 15 can be improved. Fifth, by forming the light shielding layer 16*b*, the light emitting layer of the light emitting element 15 can be protected from water, oxygen, or the like.

(Metal Terminal 21, Insulating Layer 22, and Pad Electrode 24)

The metal terminal 21 is provided on the base substrate 11, and is for supplying electric power to drive the drive circuit formed in the base substrate 11, from the outside. The metal terminal 21 is electrically connected to a power supply (not illustrated) for supplying electric power to drive the drive circuit formed in the base substrate 11. A typical material of the metal terminal 21 is, for example, Au.

The metal terminal 21 penetrates the insulating layer 22 and is in contact with the pad electrodes 24 formed on the upper surface of the base substrate 11. The insulating layer 22 is provided on the base substrate 11 and covers a part of the upper surface of the base substrate 11. The insulating layer 22 has an opening at a center of the upper surface. The metal terminal 21 covers the pad electrode 24 exposed from the opening of the insulating layer 22 and is electrically connected thereto. That is, the metal terminal 21 penetrates the insulating layer 22 to be electrically connected to the pad electrode 24. It is preferable that a part of the metal terminal 21 is in contact with the upper surface of the insulating layer 22.

The pad electrode 24 is embedded in the base substrate 11 and is provided in the drive circuit formed in the base substrate 11. A typical material of the pad electrode 24 is, for example, Al. The upper surface of the pad electrode 24 may be covered only by the metal terminal 21, or may be covered by the metal terminal 21 and the insulating layer 22. Electric power is supplied from the outside to the drive circuit formed in the base substrate 11 via the metal terminal 21 and the pad electrode 24. Since the upper surface of the pad electrode 24 is covered only with the metal terminal 21 or is covered with the metal terminal 21 and the insulating layer 22, the pad electrode 24 is prevented from being irradiated with laser light in a step of peeling the growth substrate 18 described later. Therefore, it is possible to prevent the pad electrode 24 from being damaged by the laser light.

(Dummy Element 23)

The dummy element 23 is formed above the base substrate 11. The dummy element 23 is disposed outside the light emitting element 15 when viewed in a top view, and is mechanically connected to the base substrate 11. Thus, since the dummy element 23 is formed in the base substrate 11, the dummy element 23 can be prevented from scattering when the step of peeling the growth substrate 18 described later is performed.

(Color Conversion Layers 31 and 32)

The color conversion layers 31 and 32 are made of a phosphor material such as $Y_3Al_5O_{12}$: $Ce^{3+}$, $Y_3(Al, Ga)_5O_{12}$: $Ce^{3+}$, $Lu_3Al_5O_{12}$: $Ce^+$, $(Sr, Ba)_2SiO_4$: $Eu^{2+}$, $Ca_2SiO_4$: $Eu^{2+}$, $Ca_3(Sc, Mg)_2Si_3O_{12}$: $Ce^+$, β-SiAlON: $Eu^{2+}$, Ca-α-SiAlON: $Eu^{2+}$, $La_3Si_6N_{11}$: $Ce^+$, $K_2SiF_6$: $Mn^{4+}$, $CaAlSiN_3$: $Eu^{2+}$, $(Sr, Ca)AlSiN_3$: $E^{2+}$, $(Ba, Sr)_2Si_5N_8$: $Eu^{2+}$, CdSe, CdS, ZnS, ZnSe, CdTe, InP, InGaP, GaP, GaN, or InGaN, a color conversion material such as a light absorbing material, a light scattering material such as titania, silica, or alumina, and resin used as a base material and the like, and converts a wavelength of the light emitted from the light emitting element 15. The color conversion layer 31 is a green color conversion layer that converts light emitted by the light emitting element 15 to green light, and the color conversion layer 32 is a red color conversion layer that converts light emitted by the light emitting element 15 to red light.

The color conversion layers 31 and 32 are in contact with the upper portions of the plurality of light emitting elements 15 adjacent to each other, respectively. In FIG. 2(*e*), the color conversion layers 31 and 32 are in contact with the upper portions of three light emitting elements 15, respectively. The color conversion layer 31 is in direct contact with the light emitting element 15 disposed immediately below, and the color conversion layer 32 is in direct contact with the light emitting element 15 disposed immediately below. That is, there is nothing between the color conversion layer 31 and the light emitting element 15 that shields light traveling from the light emitting element 15 toward the color conversion layer 31, and there is nothing between the color conversion layer 32 and the light emitting element 15 that shields light traveling from the light emitting element 15 to the color conversion layer 32. An upper portion of one of the three light emitting elements 15 is exposed.

A height of the color conversion layers 31 and 32 from the base substrate 11 is equal to a height of the light shielding layer 16*b* from the base substrate 11. A distance between the color conversion layer 31 and the color conversion layer 32 is preferably 0.1 μm or more and 20 μm or less when viewed in a top view. When the distance between the color conversion layer 31 and the color conversion layer 32 is 0.1 μm or more and 20 μm or less when viewed in a top view, a thickness of the portion of the light shielding layer 16*b* between the color conversion layer 31 and the color conversion layer 32 is 0.1 μm or more and 20 μm or less. This thickness is a thickness along the direction in which the color conversion layers 31 and 32 are disposed. Further, it is preferable that the color conversion layers 31 and 32 include a phosphor having a median diameter of 2 μm or less. Thereby, a size of the color conversion layers 31 and 32 can be reduced, so that a size of the semiconductor module 1 can be reduced.

(Production Method of Semiconductor Module 1)

Next, a production method of the semiconductor module 1 will be described with reference to FIGS. 1, 2, and 3.

(Step of Forming Light Emitting Element 15)

First, as illustrated in FIG. 1(*a*), a semiconductor layer 15*a* serving as a base of the light emitting element 15 described later is provided on the growth substrate 18. The growth substrate 18 is a substrate in which the semiconductor layer 15*a* is epitaxially grown.

After the semiconductor layer 15*a* is provided on the growth substrate 18, as illustrated in FIG. 1(*b*), a plurality of light emitting element-side electrodes 142 and the dummy electrode 10 that is a part of a second alignment mark piece 20 are formed on the semiconductor layer 15*a*. A well-known general electrode forming technique is used for this formation. A typical material of the light emitting element-side electrode 142 and the dummy electrode 10 is, for example, Au.

(Step of Forming Separation Groove 19)

After the light emitting element-side electrode 142 and the dummy electrode 10 are provided on the semiconductor layer 15*a*, as illustrated in FIG. 1(*c*), a plurality of separation grooves 19 are formed on the semiconductor layer 15*a* (step S110). A standard semiconductor selective etching step is used to form the separation groove 19. In FIG. 1(*c*), the separation groove 19 is formed between the adjacent light emitting element-side electrodes 142. The formed separation groove 19 reaches the surface of the growth substrate 18.

By forming the separation groove 19, one semiconductor layer 15*a* is divided into a plurality of individual light emitting elements 15 (chips) on the surface of the growth substrate 18, and the second alignment mark piece 20 juxtaposed with the plurality of light emitting elements 15 is formed. As described above, the plurality of light emitting elements 15 are formed (step of forming the plurality of light emitting elements). The second alignment mark piece 20 includes a dummy element 23 which is a semiconductor layer and the dummy electrode 10 made of the same conductive material as that of the light emitting element-side electrode 142. Further, the separation groove 19 is formed such that the width of the separation groove 19 is in the range of 0.1 µm or more and 20 µm or less. In other words, in the step of forming the plurality of light emitting elements 15, the plurality of light emitting elements 15 are formed such that the distance between the light emitting elements 15 is 0.1 µm or more and 20 µm or less when viewed in a top view. As a result, after step S170 described later is processed, a distance between recess portions formed on the upper portion of the light emitting elements 15 along the direction in which the light emitting elements 15 are disposed is 0.1 µm or more and 20 µm or less.

When the width of the separation groove 19 is 20 µm or less, an amount of laser light reaching a base substrate 11 side is reduced. Therefore, in the step of peeling the growth substrate 18 described below, damage to the base substrate 11, the metal wiring 12, the insulating layer 13, and the electrode 14 can be reduced.

On the other hand, when the width of the separation groove 19 is reduced, a capacitance between the adjacent electrodes 14 and between the adjacent light emitting elements 15 increases, and when a voltage is applied to the light emitting elements 15, an electromotive force may occur due to coupling noise between the adjacent light emitting elements 15. Accordingly, a precise lighting control of the light emitting element 15 may be hindered, or a reverse voltage may be applied to the light emitting element 15. Therefore, the light emitting element 15 may be deteriorated. For this reason, it is preferable that the width of the separation groove 19 is 0.1 µm or more.

Further, from the viewpoint of the reliability of the semiconductor module 1, it is desirable that the light emitting element 15 maintain 50% or more of a light emission intensity after lighting for 1000 hours with respect to the light emission intensity at the time of production. In order to prevent the light emitting element 15 from deteriorating due to the reverse voltage, the width of the separation groove 19 is desirably 0.1 µm or more.

(Step of Positioning Two Substrates)

After the formation of the separation groove 19, as illustrated in FIG. 1(d), the base substrate 11 is prepared on which the metal wiring 12, the insulating layer 13, the substrate-side electrode 141, and the first alignment mark piece 141a are formed in advance. For forming the substrate-side electrode 141 above the base substrate 11, well-known general electrode forming technique is used. This will be specifically described below.

The metal wiring 12 is formed on the base substrate 11. After the formation of the metal wiring 12, the insulating layer 13 is formed on the base substrate 11. When the insulating layer 13 is formed, the insulating layer 13 is patterned by wet etching or the like so that a region on the base substrate 11 where a part of the metal wiring 12 and the first alignment mark piece 141a are formed are exposed. Next, the substrate-side electrode 141 is formed so as to cover a part of the metal wiring 12 (step S120). In addition to forming the substrate-side electrode 141, the first alignment mark piece 141a is formed on the base substrate 11. A typical material of the substrate-side electrode 141 and the first alignment mark piece 141a is, for example, Au. In parallel with the preparation of the base substrate 11, as illustrated in FIG. 1(d), the growth substrate 18 is inverted. After the inversion of the growth substrate 18, the base substrate 11 and the growth substrate 18 are positioned so that each substrate-side electrode 141 and each light emitting element-side electrode 142 face each other.

(Step of Bonding Substrate)

After the positioning between the base substrate 11 and the growth substrate 18 is completed, as illustrated in FIG. 1(e), the base substrate 11 and the growth substrate 18 are bonded (step S130). At this time, the base substrate 11 and the growth substrate 18 are pressed from above and below by pressurizing. Therefore, the corresponding substrate-side electrode 141 and light emitting element-side electrode 142 are joined using the second alignment mark piece 20 on the growth substrate 18 side and the first alignment mark piece 141a on the base substrate 11 side. As a result, the corresponding substrate-side electrode 141 and light emitting element-side electrode 142 are integrated to form the electrode 14. In addition, the second alignment mark piece 20 on the growth substrate 18 side is connected to the first alignment mark piece 141a on the base substrate 11 side. Thereby, the first alignment mark piece 141a and the second alignment mark piece 20 are joined to form the alignment mark M.

(Step of Peeling Growth Substrate 18)

After the completion of the bonding, as illustrated in FIG. 2(a), the growth substrate 18 is peeled off from the plurality of light emitting element 15 (step S140: step of peeling the growth substrate from the plurality of light emitting elements). In the step of peeling the growth substrate 18, a peeling technique using laser light irradiation can be used as an example of peeling means. For example, when a transparent substrate such as sapphire is used as the growth substrate 18 and a nitride semiconductor crystal is grown as a light emitting element layer, it is possible to reduce damage to an interface between the growth substrate 18 and the crystal growth layer by irradiating with laser light from the transparent substrate side under a certain condition. A wavelength of the laser light is not particularly limited as long as it is in a range of 200 nm or more and 1100 nm or less, but it is necessary that the wavelength be a wavelength at which the growth substrate 18 can be peeled off, that is, a wavelength at which light is absorbed by the growth substrate 18.

After the growth substrate 18 is peeled off, the upper surface (surface) of the light emitting element 15 may be polished. Polishing of the upper surface of the light emitting element. 15 can be performed by chemical mechanical polish (CMP) or the like. After the upper surface of the light emitting element 15 is polished, the upper surface of the light emitting element 15 may be cleaned. Details of a method for cleaning the upper surface of the light emitting element 15 will be described later in step S190.

Further, after the upper surface of the light emitting element 15 is cleaned, the upper surface of the light emitting element 15 may be polished. When the upper surface of the light emitting element 15 is polished after the upper surface of the light emitting element 15 is cleaned, the upper surface of the light emitting element 15 is cleaned again after the upper surface of the light emitting element 15 is polished. Further, the upper surface of the light emitting element 15 may be cleaned without polishing the upper surface of the light emitting element 15.

(Step of Filling Light Shielding Layer 16)

After the growth substrate 18 is peeled off, as illustrated in FIG. 2(b), the base substrate 11 is filled with the light shielding layer 16 so as to cover the upper surface of the base substrate 11, the electrode 14, an entirely exposed surface of the light emitting element 15, the metal terminal 21, the insulating layer 22, and an entirely exposed surface of the dummy element 23 (step of filling the light shielding layer).

A state after the filling the light shielding layer 16 is illustrated in FIG. 2(b). This will be specifically described below.

A state before the light shielding layer 16 is cured is referred to as a liquid resin. The base substrate 11 is filled with a liquid resin so as to cover the upper surface of the base substrate 11, the electrode 14, the entirely exposed surface of the light emitting element 15, the metal terminal 21, the insulating layer 22, and the entirely exposed surface of the dummy element 23 (step S150).

In order to be filled with the liquid resin, for example, the base substrate 11, the electrode 14, the light emitting element 15, the metal terminals 21, the insulating layer 22, and the dummy element 23 may be immersed in a container filled with the liquid resin. As a main material of the liquid resin, a material that shields (absorbs or reflects) the light emitted from the light emitting element 15 and the color conversion layers 31 and 32 is preferable, and is preferably a white resin (hereinafter, referred to as a first material) obtained by adding submicron-size particles to a silicone-based resin or an epoxy-based resin. Examples of particles having a submicron size include titania, alumina, or silica having a particle size of 0.01 μm or more to 0.5 μm or less. Thereby, the light extraction efficiency can be improved. In addition, other than the above, the method of injecting the liquid resin may be a method of injecting the liquid resin with an injection needle, in particular, a microneedle suitable for a size of a gap formed between the base substrate 11 and the light emitting element 15. In this case, as a material of the injection needle, metal, plastic, or the like is used.

In the filling step of the light shielding layer 16, it is preferable to be filled with the liquid resin at a temperature within a temperature range of 50° C. or higher and 200° C. or less. This facilitates normal filling of the liquid resin. Further, the temperature range is more preferably 80° C. or higher and 170° C. or less. This can reduce a risk of impairing properties (adhesion after a curing process described later, heat dissipation, and the like) of the liquid resin. Further, the temperature range is still more preferably 100° C. or higher and 150° C. or less. Thereby, bubbles or the like generated in the gap formed between the base substrate 11 and the light emitting element 15 can be reduced, and the semiconductor module 1 can be almost completely filled without convection or the like. Therefore, the semiconductor module 1 can be easily produced.

As illustrated in FIG. 2(b), the liquid resin covers the upper surface of the base substrate 11, the electrode 14, the entirely exposed surface of the light emitting element 15, the metal terminal 21, the insulating layer 22, and the entirely exposed surface of the dummy element 23. After being filled with the liquid resin is completed, the liquid resin is cured to form the light shielding layer 16 (step S160). The method for curing the liquid resin is not particularly limited. For example, the liquid resin may be cured by heating the liquid resin or irradiating the liquid resin with ultraviolet rays. In addition, after the light shielding layer 16 is formed, the upper surface of the light shielding layer 16 may be polished to make the upper surface of the light shielding layer 16 flat. Further, after the upper surface of the light shielding layer 16 is polished, the upper surface of the light shielding layer 16 may be cleaned.

(Step of Removing Part of Light Shielding Layer 16)

After being filled with the light shielding layer 16, as illustrated in FIG. 2(c), the portion of the light shielding layer 16 on the upper surface of the light emitting element 15 and the portion of the light shielding layer 16 on the upper surface of the dummy element 23 are removed (step S170: step of removing the portion of the light shielding layer, and step of removing the portion of the light shielding layer on the upper surface of the dummy element). At this time, a distance, along the direction in which the light emitting elements 15 are disposed, between recess portions formed on the upper portion of the light emitting elements 15 is 0.1 μm or more and 20 μm or less. That is, a thickness of a protrusion portion formed between the recess portions along the direction in which the light emitting elements 15 are disposed is 0.1 μm or more and 20 μm or less. The light shielding layer 16a is formed by removing the portion of the light shielding layer 16 on the upper surface of the light emitting element 15 and the portion of the light shielding layer 16 on the upper surface the dummy element 23. Accordingly, the upper surface of the dummy element 23 is exposed from the light shielding layer 16a, so that a position of the dummy element 23 can be used as a reference in step S180 described later. In addition, the upper surface of the light emitting element 15 is exposed from the light shielding layer 16a.

After the portion of the light shielding layer 16 on the upper surface of the light emitting element 15 and the portion of the light shielding layer 16 on the upper surface of the dummy element 23 are removed, as illustrated in FIG. 2(d), the portion of the light shielding layer 16a on the metal terminal 21 is removed (step S180: step of removing the portion of the light shielding layer). Specifically, the light shielding layer 16b is formed by removing the portion of the light shielding layer 16a on the metal terminal 21 with reference to the position of the dummy element 23. Thereby, the upper surface of the metal terminal 21 is exposed from the light shielding layer 16b.

(Step of Cleaning Upper Surface of Light Emitting Element 15)

After the portion of the light shielding layer 16a on the metal terminal 21 is removed, the upper surface of the light emitting element 15 is cleaned (step S190: step of cleaning). After step S170 is processed, a residue remains on the upper surface of the light emitting element 15. In addition, droplets of Ga or the like are formed on the upper surface of the light emitting element 15 where the growth substrate 18 is peeled off and exposed by the laser irradiation. The droplets are likely to remain even after step S170 is processed. Therefore, one or more types of cleaning agents are selected as water (water of 30° C. or higher) having a temperature a melting point or higher of Ga, and dilute hydrochloric acid, and the exposed surface is cleaned with the cleaning agent.

After the portion of the light shielding layer 16a on the metal terminal 21 is removed, the upper surface of the light emitting element 15 may be polished (step of polishing). After the upper surface of the light emitting element 15 is polished, the upper surface of the light emitting element 15 may be cleaned (step of cleaning the upper surface of the light emitting element after polishing the upper surface of the light emitting element). Further, after the upper surface of the light emitting element 15 is cleaned, the upper surface of the light emitting element 15 may be polished. When the upper surface of the light emitting element 15 is polished after the upper surface of the light emitting element 15 is cleaned, the upper surface of the light emitting element 15 is cleaned again after the upper surface of the light emitting element 15 is polished.

In the step of cleaning the upper surface of the light emitting element 15, water (30° C. or higher) having a temperature at a melting point or higher of Ga is applied to the upper surface of the light emitting element 15 to wash away the upper surface, or the upper surface or the entire light emitting element 15 is immersed in water (water at 30° C. or higher) at a temperature at a melting point or higher of Ga. Therefore, residues on the upper surface of the light emitting element 15 can be removed. It is also preferable to immerse the upper surface of the light emitting element 15 in dilute hydrochloric acid at room temperature or boiled dilute hydrochloric acid, or to wash away the upper surface of the light emitting element 15 with dilute hydrochloric acid at room temperature or boiled dilute hydrochloric acid. Further, it is more preferable that first, the upper surface of the light emitting element 15 is washed away with water (water at 30° C. or higher) at a temperature at the melting point or higher of Ga, and is immersed in water (water at 30° C. or higher) at a temperature of the melting point or higher of Ga, and then immersed in dilute hydrochloric acid.

When the upper surface of the light emitting element 15 is not cleaned, light is absorbed, reflected, and scattered by the residue remaining on the upper surface of the light emitting element 15 and/or droplets of Ga, or the like, and the light emitted from the light emitting element 15 is shielded. Therefore, the light extraction efficiency of the light emitting element 15 decreases. Further, by cleaning the upper surface of the light emitting element 15, light emitted from the light emitting element 15 is not shielded. Therefore, the light extraction efficiency of the light emitting element 15 can be significantly improved. In addition, the temperature of the hot water used for cleaning the upper surface of the light emitting element 15 is preferably the melting point or higher of Ga, and the temperature of dilute hydrochloric acid is preferably room temperature or higher and 110° C. or less.

In addition, by cleaning the upper surface of the light emitting element 15, it is possible to prevent the residue from remaining on the upper surface of the light emitting element 15. Therefore, when the color conversion layers 31 and 32 are disposed on the light emitting element 15, the color conversion layers 31 and 32 can be applied or patterned on a plane where no residue remains. Thereby, the color conversion layer having a more uniform thickness can be disposed on the plurality of light emitting elements 15.

(Step of Disposing Color Conversion Layers 31 and 32)

After the upper surface of the light emitting element 15 is cleaned, as illustrated in FIG. 2(e), the color conversion layers 31 and 32 are disposed on the upper portion of the light emitting element 15 (step S200: step of forming the color conversion layer). Specifically, the color conversion layer 31 is disposed on the upper portion of the light emitting element 15, and the color conversion layer 32 is disposed on the upper portion of the light emitting element 15 adjacent to the light emitting element 15 where the color conversion layer 31 is disposed.

As described above, in the semiconductor module 1, the light shielding layers 16b are disposed between the light emitting elements 15 adjacent to each other and between the color conversion layers 31 and 32 adjacent to each other. Accordingly, the light emitted from the side surface of the light emitting element 15 and the side surfaces of the color conversion layers 31 and 32 can be shielded. Therefore, the light emitted from the color conversion layer 31 and the light emitted from the color conversion layer 32 can be reduced to be mixed. Therefore, it is possible to prevent an influence of the light between the color conversion layers 31 and 32 adjacent to each other, so that the light emitted from each light emitting element 15 can be emphasized. In the semiconductor module 1, the color conversion layers 31 and 32 are in direct contact with the light emitting element 15. That is, since there is nothing between the color conversion layers 31 and 32, and the light emitting element 15 that shields light traveling from the light emitting element 15 to the color conversion layers 31 and 32, the light emitted from the light emitting element 15 is not attenuated, and enters the color conversion layers 31 and 32. Therefore, the light extraction efficiency of the light emitted from the light emitting element 15 can be improved.

Embodiment 2

Figure 4:
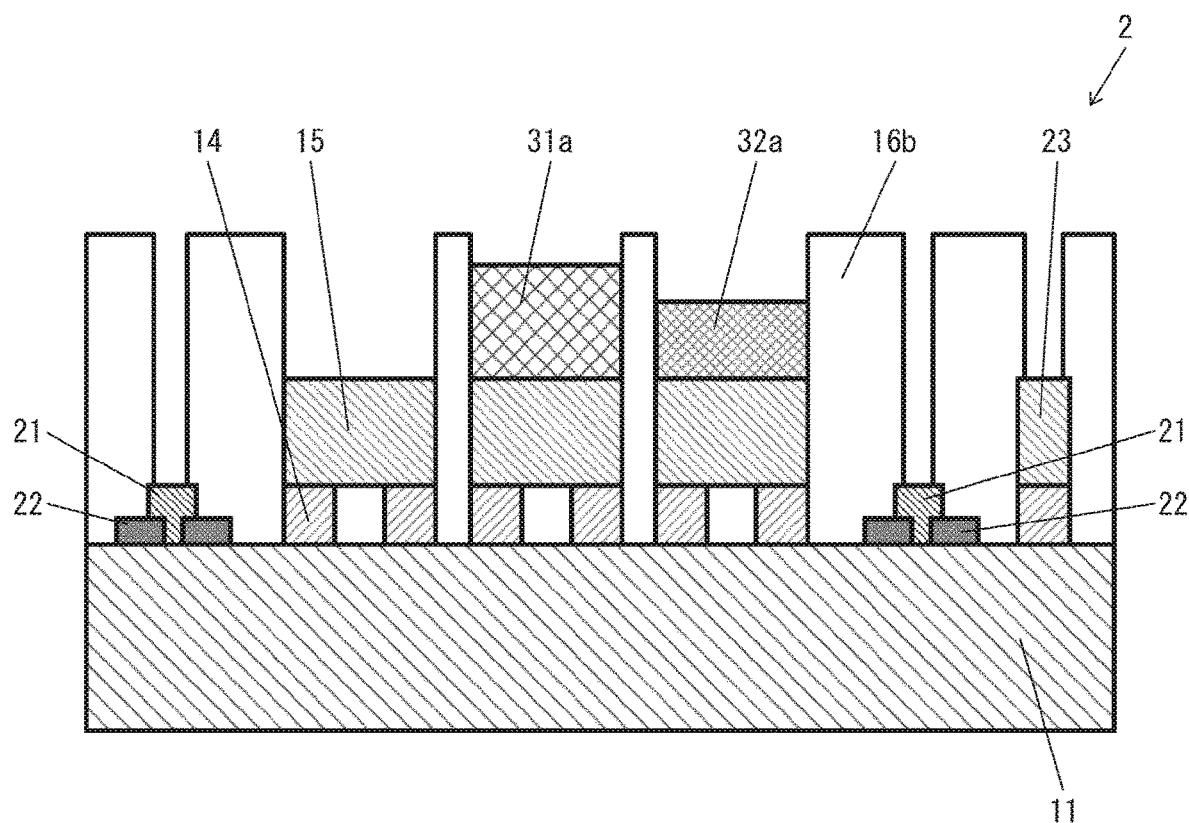
FIG. 4 is a sectional view illustrating a configuration of a semiconductor module according to Embodiment 2 of the present invention.

FIG. 4 is a sectional view illustrating a configuration of a semiconductor module 2 according to Embodiment 2 of the present invention. For convenience of description, members having the same functions as those described in the embodiment described above are denoted by the same reference numerals, and description thereof will not be repeated.

(Configuration of Semiconductor Module 2)

As illustrated in FIG. 4, the semiconductor module 2 is different from the semiconductor module 1 in that the color conversion layers 31 and 32 are changed to color conversion layers 31a and 32a. Thicknesses of the color conversion layers 31a and 32a in the direction from the base substrate 11 to the light emitting element 15 are different from those of the color conversion layers 31 and 32. Heights of the color conversion layers 31a and 32a from the base substrate 11 are preferably lower than that of the light shielding layer 16b from the base substrate 11. Accordingly, the light emitted from the side surface of the light emitting element 15 and the side surfaces of the color conversion layers 31a and 32a can be shielded. Therefore, the light emitted from the color conversion layer 31a and the light emitted from the color conversion layer 32a can be reduced to be mixed. Therefore, it is possible to prevent the influence of light between the color conversion layers 31a and 32a adjacent to each other, so that the light emitted from each light emitting element 15 can be made to emphasize.

The thickness of the color conversion layer 31a in the direction from the base substrate 11 to the light emitting element 15 may be different from the thickness of the color conversion layer 32a in the direction from the base substrate 11 to the light emitting element 15. Further, a concentration of the phosphor contained in the color conversion layer 31a may be different from a concentration of the phosphor contained in the color conversion layer 32a. By setting the concentration of the phosphor contained in each color conversion layer and the thickness of each color conversion layer in the direction from the base substrate 11 to the light emitting element 15 for each color conversion layer, a chromaticity of light emitted from each color conversion layer can be adjusted.

Embodiment 3

Figure 5:
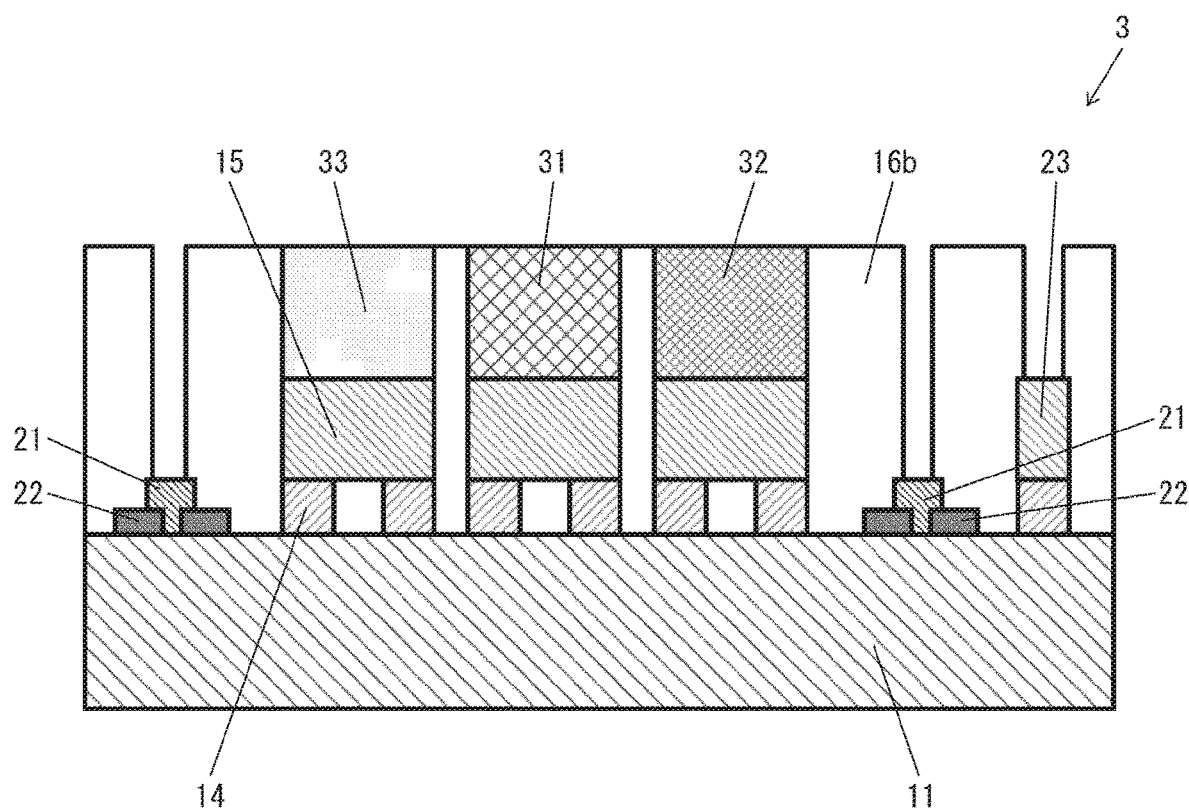
FIG. 5 is a sectional view illustrating a configuration of a semiconductor module according to Embodiment 3 of the present invention.

FIG. 5 is a sectional view illustrating a configuration of a semiconductor module 3 according to Embodiment 3 of the present invention. For convenience of description, members having the same functions as those described in the embodiment described above are denoted by the same reference numerals, and description thereof will not be repeated.

(Configuration of Semiconductor Module 3)

As illustrated in FIG. 5, the semiconductor module 3 is different from the semiconductor module 1 in that a transparent resin layer 33 is disposed on above one light emitting element 15 of the three light emitting elements. The transparent resin layer 33 allows the light emitted from the light emitting element 15 to pass therethrough, and emits the light from the upper surface. The transparent resin layer 33 allows the light to pass therethrough without converting the wavelength of the light emitted from the light emitting element 15 disposed immediately below. That is, the transparent resin layer 33 emits blue light. The transparent resin layer 33 may include a scattering material such as silica as needed.

The semiconductor module 3 disposes a color conversion layer 31, which is a green conversion layer, a color conversion layer 32, which is a red conversion layer, and a transparent resin layer 33, on each upper portion of the three light emitting elements 15. Therefore, three primary colors of red light, green light, and blue light can be emitted. The light emitting element 15 can be protected by disposing the transparent resin layer 33 on the upper portion of the light emitting element 15 at the portion where blue light is emitted to the outside. In addition, it is easier to obtain optical characteristics by disposing those having the same light diffusing property on the upper portions of the three light emitting elements 15. That is, production of the semiconductor module 3 is easy. Further, the display device in which the semiconductor module 3 is incorporated can perform color display by controlling each light emitting element 15.

Embodiment 4

Figure 6:
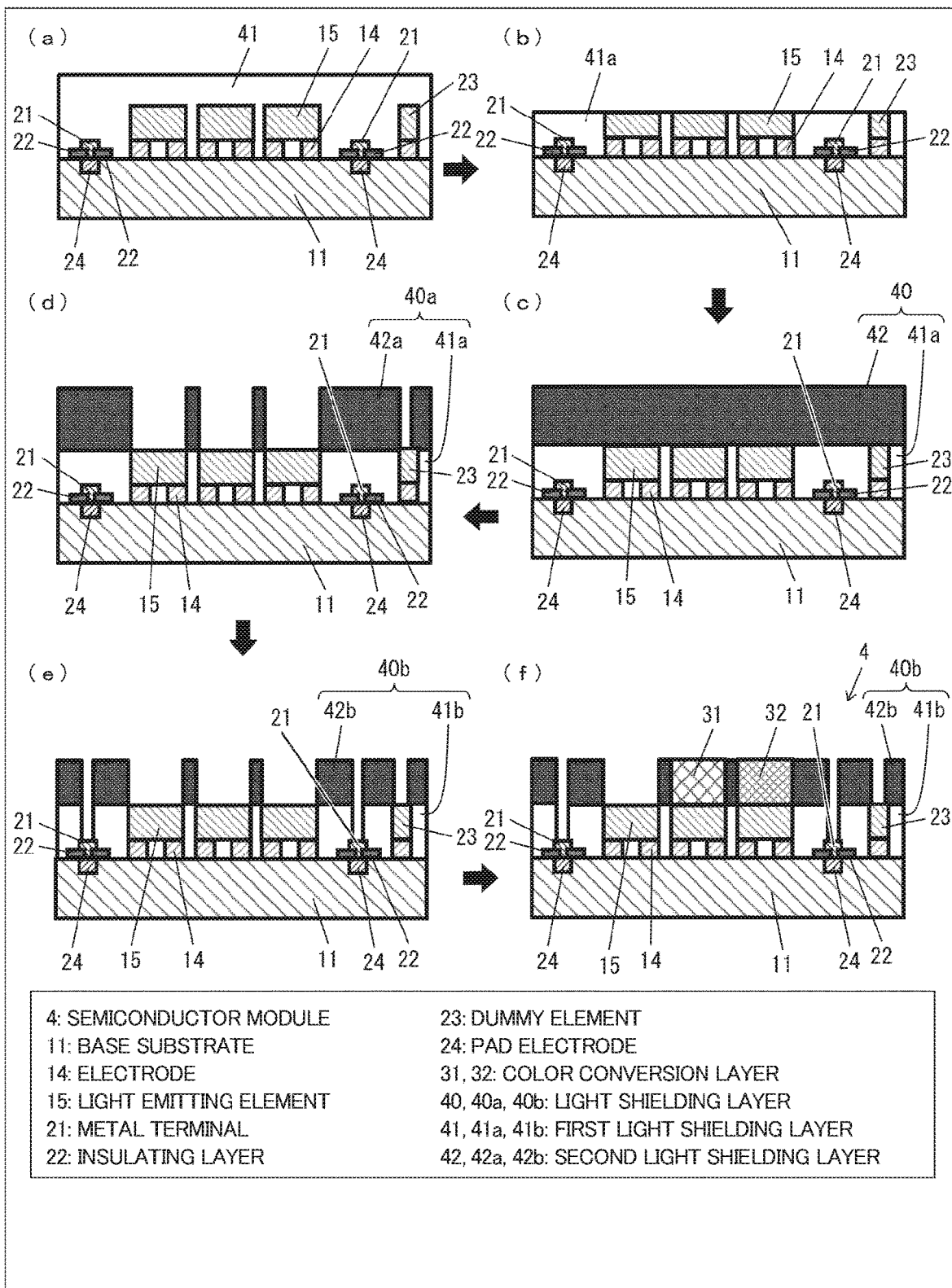
FIG. 6 is a view illustrating a production method of a semiconductor module according to Embodiment 4 of the present invention.

FIG. 6 is a view illustrating a production method of a semiconductor module 4 according to Embodiment 4 of the present invention. FIG. 7 is a flowchart illustrating the production method of the semiconductor module 4 according to Embodiment 4 of the present invention. A configuration and the production method of the semiconductor module 4 will be described with reference to FIGS. 6 and 7. FIG. 6 is a simplified view of a part of the configuration of the semiconductor module 1 illustrated in FIG. 1, in which the metal wiring 12 and the insulating layer 13 are omitted, and the substrate-side electrode 141 and the light emitting element-side electrode 142 are displayed as the electrode 14.

(Configuration of Semiconductor Module 4)

As illustrated in FIG. 6(f), the semiconductor module 4 is different from the semiconductor module 1 in that the light shielding layer 16b is changed to a first light shielding layer 41b and a second light shielding layer 42b. In the semiconductor module 4, the light shielding layer disposed between the light emitting elements 15 adjacent to each other and between the color conversion layers 31 and 32 adjacent to each other includes a plurality of layers. The plurality of layers may include, for example, the first light shielding layer 41b and the second light shielding layer 42b made of a material different from that of the first light shielding layer 41b. Further, the second light shielding layer 42b is disposed on an upper portion of the first light shielding layer 41b. Further, a height of the boundary position between the first light shielding layer 41b and the second light shielding layer 42b from the base substrate 11 is equal to a height of the boundary position between the light emitting element 15 and the color conversion layers 31 and 32 from the base substrate 11.

Thereby, the side surface of the light emitting element 15 is covered only with the first shielding layer 41b, and the color conversion layers 31 and 32 are covered only with the second light shielding layer 42b. Therefore, when the optical characteristics required for the light emitting element 15 are determined from the optical characteristics required for the semiconductor module 4, the first light shielding layer 41b having appropriate optical characteristics to obtain the optical characteristics required for the light emitting element 15 can be formed. In addition, when the optical characteristics required for the color conversion layers 31 and 32 are determined from the optical characteristics required for the semiconductor module 4, the second light shielding layer 42b having appropriate optical characteristics to obtain the optical characteristics required for the color conversion layers 31 and 32 can be formed. Therefore, each of the first light shielding layer 41a and the second light shielding layer 42b can have appropriate optical characteristics, so that the semiconductor module 4 having excellent characteristics can be realized.

The first light shielding layer 41b is disposed between the light emitting elements 15, and the second light shielding layer 42b is disposed between the color conversion layers 31 and 32. A height of the first light shielding layer 41b from the base substrate 11 is equal to a height of the light emitting element 15 from the base substrate 11, and a height of the second light shielding layer 42b from the base substrate 11 is equal to a height of the color conversion layers 31 and 32 from the base substrate 11.

(Production Method of Semiconductor Module 4)

Next, the production method of the semiconductor module 4 will be described with reference to FIGS. 6 and 7. Steps S210 to S240 are the same as steps S110 to S140.

(Step of Filling First Light Shielding Layer 41)

After the growth substrate 18 is peeled off, as illustrated in FIG. 6(a), above the base substrate 11 is filled with the first light shielding layer 41 so as to cover the upper surface of the base substrate 11, the electrode 14, the entirely exposed surface of the light emitting element 15, the metal terminal 21, the insulating layer 22, and the entirely exposed surface of the dummy element 23 (step of filling the first shielding layer). The filling method of the first light shielding layer 41 is the same as the filling method of the light shielding layer 16 of the semiconductor module 1. In the filling method of the first light shielding layer 41, after being filled with the first liquid resin (step S250), the first liquid resin is cured (step S260) to form the first light shielding layer 41. The first liquid resin is in a state before the first light shielding layer 41 is cured. A main material of the first liquid resin is the same as a main material of the liquid resin in a state before the light shielding layer 16 of the semiconductor module 1 is cured.

(Step of Removing Part of First Light Shielding Layer 41)

After the step of filling the first light shielding layer 41, a part of the first light shielding layer 41 is removed (step S270). Specifically, the portion of the first light shielding layer 41 above the surface including the upper surface of the plurality of light emitting elements 15 as a boundary is removed (step of removing the portion of the first light shielding layer).

(Step of Polishing Upper Surface of Light Emitting Element 15)

After the portion of the first light shielding layer 41 above the height of the upper surface of the light emitting element 15 from the base substrate 11 is removed, the upper surface (surface) of the light emitting element 15 is polished (step S280: step of polishing). The polishing method of the upper surface of the light emitting element 15 is the same as the polishing method of the upper surface of the light emitting element 15 of the semiconductor module 1 after the growth substrate 18 is peeled off.

(Step of Cleaning Upper Surface of Light Emitting Element 15)

After the upper surface of the light emitting element 15 is polished, the upper surface of the light emitting element 15 is cleaned (step S290: step of cleaning). After step S270 is processed, step S280 may be processed after step S290 is processed. When the step of polishing is performed after the step of cleaning, the step of polishing is performed, and then the step of cleaning is performed again. After step S270 is processed, step S290 may be processed without performing step S280, or step S280 may be processed without performing step S290.

The cleaning method of the upper surface of the light emitting element 15 is the same as the cleaning method of the upper surface of the light emitting element 15 of the semiconductor module 1. By polishing the upper surface of the light emitting element 15 and/or cleaning the upper surface of the light emitting element 15, no residue can be left on the upper surface of the light emitting element 15 and the upper surface of the first light shielding layer 41a. In particular, by polishing the upper surface of the light emitting element 15, the upper surface of the light emitting element 15 and the upper surface of the first light shielding layer 41a can be made substantially flat. Therefore, when the color conversion layers 31 and 32 are disposed on the light emitting element 15, the color conversion layers 31 and 32 can be applied or patterned on a plane where no residue remains. Thereby, the color conversion layer having a more uniform thickness can be disposed on the plurality of light emitting elements 15.

(Step of Forming Second Light Shielding Layer 42)

After the upper surface of the light emitting element 15 is cleaned, as illustrated in FIG. 6(c), the second light shielding layer 42 is formed on the upper surface of the light emitting element 15, the upper surface of the dummy element 23, and the upper surface of the first light shielding layer 41a (Step of forming the second light shielding layer). The second light shielding layer 42 is made of a material different from the material of the first light shielding layer 41a. FIG. 6(c) illustrates a state after filling the second light shielding layer 42. This will be specifically described below.

A state before the second light shielding layer 42 is cured is referred to as a second liquid resin. The upper surface of the light emitting element 15, the upper surface of the dummy element 23, and the upper surface of the first light shielding layer 41a are filled with second liquid resin so as to be covered (step S300). In order to be filled with the second liquid resin, for example, the base substrate 11, the light emitting element 15, the dummy element 23, and the first light shielding layer 41a may be immersed in a container filled with the second liquid resin. As a main material of the second liquid resin, a material that shields (absorbs or reflects) the light emitted from the light emitting element 15, and the color conversion layers 31 and 32 is preferable, and a material (hereinafter, referred to as a second material) obtained by adding carbon black or a black pigment to silicone-based resin or epoxy-based resin is preferable.

The main material of the first liquid resin may be the second material, and the main material of the second liquid resin may be the first material. Further, the main material of the first liquid resin may be the same as the main material of the second liquid resin, and both the main material of the first liquid resin and the main material of the second liquid resin may be the first material or the second material. Further, the main material of the first liquid resin may be different from the main material of the second liquid resin, and both the main material of the first liquid resin and the main material of the second liquid resin may be the first material or the second material. An injecting method of the second liquid resin may be an injecting method of the second liquid resin with an injection needle, particularly a microneedle, in addition to the above. In this case, as a material of the injection needle, metal, plastic, or the like is used.

In the step of forming the second light shielding layer 42, the second liquid resin is preferably formed at a temperature within a temperature range of 50° C. or higher and 200° C. or less. Thereby, it is easy to form the second liquid resin normally. Further, the temperature range is more preferably 80° C. or higher and 170° C. or less. This can reduce the risk of impairing the properties (adhesion after a curing process described below, heat dissipation, and the like) of the second liquid resin. Further, the temperature range is still more preferably 100° C. or higher and 150° C. or less. Thereby, bubbles or the like generated in the second liquid resin can be reduced, and the second liquid resin can be formed almost completely without convection or the like, and the semiconductor module 4 can be easily produced.

As illustrated in FIG. 6(c), the second liquid resin covers the upper surface of the light emitting element 15, the upper surface of the dummy element 23, and the upper surface of the first light shielding layer 41a. After the formation of the second liquid resin is completed, the second liquid resin is cured to form the second light shielding layer 42 (step S310). The curing method of the second liquid resin is not particularly limited. For example, the second liquid resin may be cured by heating the second liquid resin or irradiating the second liquid resin with ultraviolet rays.

(Step of Removing Part of Second Light Shielding Layer 42)

After the formation of the second light shielding layer 42, as illustrated in FIG. 6(d), the portion of the second light shielding layer 42 on the upper surface of the light emitting element 15 and the portion of the second light shielding layer 42 on the upper surface of the dummy element 23 are removed (step S320). By removing the portion of the second light shielding layer 42 on the upper surface of the light emitting element 15 and the portion of the second light shielding layer 42 on the upper surface of the dummy element 23, the second light shielding layer 42a is formed Thus, the upper surface of the dummy element 23 is exposed from the second light shielding layer 42a, so that the position of the dummy element 23 can be used as a reference in step S330 described later. In addition, the upper surface of the light emitting element 15 is exposed from the second light shielding layer 42a.

After the portion of the second light shielding layer 42 on the upper surface of the light emitting element 15 and the portion of the second light shielding layer 42 on the upper surface of the dummy element 23 are removed, as illustrated in FIG. 6(e), a part of the second light shielding layer 42a is removed. Specifically, the first light shielding layer 41b and the second light shielding layer 42b are formed by removing the portions of the first light shielding layer 41a and the second light shielding layer 42a on the metal terminal 21 with reference to the position of the dummy element 23 (step S330: step of removing the portion of the second light shielding layer). Thereby, the upper surface of the metal terminal 21 is exposed from the first light shielding layer 41b and the second light shielding layer 42b.

(Step of Disposing Color Conversion Layers 31 and 32)

After the portion of the second light shielding layer 42a on the light emitting element 15 is removed and the portions of the first light shielding layer 41a and the second light shielding layer 42a on the metal terminal 21 are removed, as illustrated in FIG. 6(f), the color conversion layers 31 and 32 are disposed on the upper portion of the light emitting element 15 (step S340: step of forming the color conversion layer). Specifically, the color conversion layer 31 is disposed on the upper portion of the light emitting element 15, and the color conversion layer 32 is disposed on the upper portion of the light emitting element 15 adjacent to the light emitting element 15 where the color conversion layer 31 is disposed.

Embodiment 5

FIG. 8 is a sectional view illustrating a configuration of a semiconductor module 5 according to Embodiment 5 of the present invention. For convenience of description, members having the same functions as those described in the embodiment described above are denoted by the same reference numerals, and description thereof will not be repeated.

(Configuration of Semiconductor Module 5)

As illustrated in FIG. 8, the semiconductor module 5 is different from the semiconductor module 4 in that a second dummy element 51 is formed above the base substrate 11. The second dummy element 51 is formed around a plurality of light emitting elements 15 when viewed in a top view, that is, outside the light emitting element 15 and inside the dummy element 23. Accordingly, when the upper surface of the light emitting element 15 is polished, a large load is applied to the second dummy element 51. Therefore, when the upper surface of the light emitting element 15 is polished, cracking of the light emitting element 15 can be reduced.

[Summary]

The semiconductor module 1, 2, 3, 4, and 5 according to Aspect 1 of the present invention include the base substrate 11 in which the drive circuit is formed; the plurality of light emitting elements 15 electrically connected to the drive circuit; the plurality of color conversion layers 31, 32, 31a, and 32a being in contact with each upper portion of the plurality of light emitting elements adjacent to each other; and the light shielding layer 16b disposed between the light emitting elements adjacent to each other and between the color conversion layers adjacent to each other, and separating the plurality of light emitting elements and the plurality of color conversion layers.

According to the configuration described above, in the semiconductor module, the light shielding layer is disposed between the light emitting elements adjacent to each other and between the color conversion layers adjacent to each other. Accordingly, the light emitted from the side surface of the light emitting element and the side surface of the color conversion layer can be shielded, so that the light emitted from the color conversion layer and the light emitted from the color conversion layer are reduced to be mixed. Therefore, it is possible to prevent the influence of the light between the color conversion layers adjacent to each other, so that the light emitted from each light emitting element can be emphasized. Further, in the semiconductor module, the color conversion layer is in contact with the light emitting element. That is, since there is nothing between the color conversion layer and the light emitting element, which shields light traveling from the light emitting element to the color conversion layer, the light emitted from the light emitting element enters the color conversion layer without attenuation. Therefore, the light extraction efficiency of the light emitted from the light emitting element can be improved.

In the semiconductor module 1, 2, 3, 4, and 5 according to Aspect 2 of the present invention, in Aspect 1, the distance between the light emitting elements 15 may be 0.1 μm or more and 20 μm or less when viewed in a top view.

According to the configuration described above, the distance between the light emitting elements is 0.1 μm or more and 20 μm or less when viewed in a top view. Thus, for example, when the growth substrate is peeled off, the intensity of the laser light reaching the base substrate when irradiating with the laser light is low. For this reason, damage to the base substrate caused when the growth substrate is peeled off can be reduced. Therefore, in the step of peeling the growth substrate or the like, damage to the base substrate having the drive circuit for driving the light emitting element can be reduced.

In the semiconductor module 1, 2, 3, 4, and 5 according to Aspect 3 of the present invention, in Aspect 1 or 2, the distance between the color conversion layers 31, 32, 31a, and 32a may be 0.1 μm or more and 20 μm or less when viewed in a top view.

According to the configuration described above, the distance between the color conversion layers is 0.1 μm or more and 20 μm or less when viewed in a top view. Therefore, it is possible to prevent the influence of the light between the color conversion layers adjacent to each other, so that the light emitted from each light emitting element can be emphasized.

The semiconductor module 1, 2, 3, 4, and 5 according to Aspect 4 of the present invention, in any one of Aspects 1 to 3, may include the metal terminal 21 provided on the base substrate 11 and supplying electric power for driving the drive circuit from the outside; and the insulating layer 22 provided on the base substrate and covering a part of the upper surface of the base substrate. The metal terminal may penetrate the insulating layer and be in contact with the pad electrode 24 formed on the upper surface of the base substrate, and a part of the metal terminal may be in contact with the upper surface of the insulating layer.

In the semiconductor module 1, 2, 3, 4, and 5 according to Aspect 5 of the present invention, in Aspect 4, the upper surface of the pad electrode 24 may be covered with the metal terminal 21 and the insulating layer 22.

According to the configuration described above, the upper surface of the pad electrode is covered with the metal terminal and the insulating layer. Thus, for example, when the step of peeling the growth substrate is performed by laser irradiation from the light emitting element, the pad electrode can be prevented from being irradiated with laser light. Therefore, it is possible to prevent the pad electrode from being damaged by the laser light.

The semiconductor module 1, 2, 3, 4, and 5 according to Aspect 6 of the present invention, in any one of Aspects 1 to 5, may further include the dummy element 23 formed above the base substrate 11.

According to the configuration described above, the semiconductor module includes the dummy element formed above the base substrate. Thus, for example, when the step of removing a part of the light shielding layer is performed, it is possible to remove a part of the light shielding layer with reference to the position of the dummy element. Further, since the dummy element is formed above the base substrate, for example, when the step of peeling the growth substrate from the light emitting element is performed, scattering of the dummy element can be prevented.

In the semiconductor module 1, 2, 3, 4, and 5 according to Aspect 7 of the present invention, in any one of Aspects 1 to 6, the color conversion layers 31, 32, 31a, and 32a may have the phosphor having a median diameter of 2 μm or less.

According to the configuration described above, the color conversion layer has the phosphor having the median diameter of 2 μm or less. Thereby, even if the thickness of the color conversion layer is reduced, the color conversion layer can convert the color of the light emitted from the light emitting element. Therefore, since the thickness of the color conversion layer is reduced, the size of the semiconductor module can be reduced.

In the semiconductor module 2 according to Aspect 8 of the present invention, in any one of Aspects 1 to 7, the height of the color conversion layers 31a and 32a from the base substrate 11 may be lower than the height of the light shielding layer 16b from the base substrate.

According to the configuration described above, the light emitted from the side surface of the light emitting element and the side surface of the color conversion layer can be shielded, so that the light emitted from the color conversion layer and the light emitted from the color conversion layer are reduced to be mixed. Therefore, it is possible to prevent the influence of the light between the color conversion layers adjacent to each other, so that the light emitted from each light emitting element can be emphasized.

In the semiconductor module 4 and 5 according to Aspect 9 of the present invention, in any one of Aspects 1 to 8, the light shielding layer may include the plurality of layers.

In the semiconductor module 4 and 5 according to Aspect 10 of the present invention, in Aspect 9, the plurality of layers may include the first light shielding layer 41b and the second light shielding layer 42b that is made of a material different from the material of the first light shielding layer.

According to the configuration described above, the material of the first light shielding layer disposed between the light emitting elements is different from the material of the second light shielding layer disposed between the color conversion layers. Accordingly, the material of the first light shielding layer and the material of the second light shielding layer can be set according to the optical characteristics of the light emitting element and the optical characteristics of the color conversion layer.

In the semiconductor module 4 and 5 according to Aspect 11 of the present invention, in Aspect 10, the second light shielding layer 42b may be disposed on the upper portion of the first light shielding layer 41b, and the height of the boundary position between the first light shielding layer and the second light shielding layer from the base substrate 11 may be equal to the height of the boundary position between the light emitting elements 15 and the color conversion layers 31 and 32 from the base substrate.

The semiconductor module 5 according to Aspect 12 of the present invention, in Aspect 6, may further include the second dummy element 51 formed above the base substrate 11, the second dummy element may be outside the light emitting elements 15 and inside the dummy element 23 when viewed in a top view.

According to the configuration described above, the second dummy element is disposed outside the light emitting element and inside the dummy element when viewed in a top view. Thereby, for example, when the upper surface of the light emitting element is polished, a large load is applied to the second dummy element. Therefore, when the upper surface of the light emitting element is polished, cracking of the light emitting element can be reduced.

In the semiconductor modules 1, 2, and 3 according to Aspect 13 of the present invention, in any of one of Aspects 1 to 12, the light shielding layer 16b may be formed to include white resin.

According to the configuration described above, the light shielding layer is formed to include the white resin. Therefore, the light extraction efficiency can be improved.

The semiconductor module 1, 2, 3, 4, and 5 according to Aspect 14 of the present invention includes the base substrate 11 in which the drive circuit is formed; the plurality of light emitting elements 15 electrically connected to the drive circuit; the light shielding layer 16b disposed between the light emitting elements adjacent to each other and separating the plurality of light emitting elements; the metal terminal 21 provided on the base substrate and supplying electric power for driving the drive circuit from outside; and the insulating layer 22 provided on the base substrate and covering a part of the upper surface of the base substrate. The metal terminal penetrates the insulating layer and is in contact with the pad electrode 24 formed on the upper surface of the base substrate. A part of the metal terminal is in contact with the upper surface of the insulating layer.

The display device according to Aspect 15 of the present invention, in any one of Aspects 1 to 14, may include the semiconductor module 1, 2, 3, 4, and 5.

The production method of the semiconductor module 1, 2, 3, 4, and 5 according to Aspect 16 of the present invention includes the step of forming the plurality of light emitting elements 15 from the semiconductor layer grown on the growth substrate 18; the step of peeling the growth substrate from the plurality of light emitting elements by laser irradiation; the step of filling the light shielding layer 16 on the base substrate so as to cover the upper surface of the base substrate 11 and the entirely exposed surface of the light emitting elements, after the step of peeling the growth substrate; the step of removing the portion of the light shielding layer on the upper surface of the light emitting elements, after the step of filling the light shielding layer; and the step of forming the color conversion layer 31, 32, 31a, and 32a on the upper portion of the light emitting elements. The plurality of light emitting elements are electrically connected to the drive circuit formed in the base substrate.

In the production method of the semiconductor module 1, 2, 3, 4, and 5 according to Aspect 17 of the present invention, in Aspect 16, in the step of forming the light emitting element 15, the plurality of the light emitting elements may be formed so that the distance between the light emitting elements is 0.1 µm or more and 20 µm or less when viewed in a top view.

In the production method of the semiconductor module 1, 2, 3, 4, and 5 according to Aspect 18 of the present invention, in Aspect 16 or 17, the step of removing the portion of the light shielding layer 16 may include the step of polishing the upper surface of the light emitting elements 15, the step of cleaning the upper surface of the light emitting elements, or the step of cleaning the upper surface of the light emitting elements, after the upper surface of the light emitting elements is polished.

According to the configuration described above, no residue can be left on the upper surface of the light emitting element. Further, the light emitted from the light emitting element 15 is not shielded by the residue. Therefore, the light extraction efficiency of the light emitting element can be significantly improved. For example, when the color conversion layer is disposed on the light emitting element, the color conversion layer can be applied or patterned on the plane where no residue remains. Thereby, the color conversion layer having a more uniform thickness can be disposed on the plurality of light emitting elements.

In the production method of the semiconductor module 1, 2, 3, 4, and 5 according to Aspect 19 of the present invention, in any one of Aspects 16 to 18, the step of removing the portion of the light shielding layer 16 may include the step of removing the portion of the light shielding layer on the upper surface of the dummy element 23 formed above the base substrate 11.

According to the configuration described above, since the upper surface of the dummy element is exposed from the light shielding layer, the position of the dummy element can be used as the reference in the step of removing the light shielding layer.

The production method of the semiconductor module 4 and 5 according to Aspect 20 of the present invention includes the step of forming the plurality of light emitting elements 15 from the semiconductor layer grown on the growth substrate 18; the step of peeling the growth substrate from the plurality of light emitting element by laser irradiation; the step of filling the first light shielding layer 41 on the base substrate so as to cover the upper surface of the base substrate 11 and the entirely exposed surface of the light emitting elements, after the step of peeling the growth substrate; the step of removing the portion of the first light shielding layer above the height of the upper surface of the light emitting elements from the base substrate, after the step of filling the first light shielding layer; the step of forming the second light shielding layer 42 made of a material different from the material of the first light shielding layer, on the upper portion of the first light shielding layer, after the step of removing the portion of the first light shielding layer; the step of removing the portion of the second light shielding layer on the upper surface of the light emitting elements, after the step of forming the second light shielding layer; and the step of forming the color conversion layer on the upper portion of the light emitting elements. The plurality of light emitting elements are electrically connected to the drive circuit formed in the base substrate.

According to the configuration described above, the same effects as in Aspect 10 are achieved.

The production method of the semiconductor module 1, 2, 3, 4, and 5 according to Aspect 21 of the present invention includes the step forming the plurality of light emitting elements 15 from the semiconductor layer grown on the growth substrate 18; the step of peeling the growth substrate from the plurality of light emitting elements by laser irradiation; the step of filling the light shielding layer 16 on the base substrate, so as to cover the upper surface of the base substrate 11, the entirely exposed surface of the light emitting elements, and the metal terminal 21, after the step of peeling the growth substrate; and the step of removing the portion of the light shielding layer on the upper surface of the light emitting elements and the portion of the light shielding layer on the metal terminal, after the step of filling the light shielding layer. The plurality of light emitting elements are electrically connected to the drive circuit formed in the base substrate. The metal terminal is provided on the base substrate, and supplies electric power from outside to drive the drive circuit.

The present invention is not limited to the embodiments described above, and various modifications are possible within the scope illustrated in the claims, and embodiments obtained by appropriately combining technical means disclosed in different embodiments are also included in the technical scope of the present invention. Furthermore, a new technical feature can be formed by combining the technical means disclosed in each embodiment.

REFERENCE SIGNS LIST 1, 2, 3, 4, 5 semiconductor module
10 dummy electrode
11 base substrate
12 metal wiring
13, 22 insulating layer
14 electrode
15 light emitting element
16, 16a, 16b light shielding layer
18 growth substrate
19 separation groove
20 second alignment mark piece
21 metal terminal
23 dummy element
24 pad electrode
31, 32, 31a, 32a color conversion layer
33 transparent resin layer
41, 41a, 41b first light shielding layer
42, 42a, 42b second light shielding layer
51 second dummy element
141 substrate-side electrode
141a first alignment mark piece
142 light emitting element-side electrode
M alignment mark

The invention claimed is:

1. A semiconductor module comprising:
a base substrate in which a drive circuit is formed;
a plurality of light emitting elements electrically connected to the drive circuit;
a plurality of color conversion layers respectively being in contact with upper portions of the plurality of light emitting elements adjacent to each other;
a light shielding layer disposed between the plurality of light emitting elements adjacent to each other and between the plurality of color conversion layers adjacent to each other, and separating the plurality of light emitting elements and the plurality of color conversion layers; and
a dummy element formed above the base substrate, wherein
the light shielding layer covers an upper surface of the base substrate, the dummy element, side surfaces of the plurality of light emitting elements, and side surfaces of the plurality of color conversion layers.

2. The semiconductor module according to claim 1, wherein a distance between the plurality of light emitting elements is 0.1 µm or more and 20 µm or less when viewed in a top view.

3. The semiconductor module according to claim 1, wherein a distance between the plurality of color conversion layers is 0.1 µm or more and 20 µm or less when viewed in a top view.

4. The semiconductor module according to claim 1, further comprising:
a metal terminal provided on the base substrate and supplying electric power from outside to drive the drive circuit; and
an insulating layer provided on the base substrate and covering a part of the upper surface of the base substrate,
wherein the metal terminal penetrates the insulating layer and is in contact with a pad electrode formed on the upper surface of the base substrate, and
wherein a part of the metal terminal is in contact with an upper surface of the insulating layer.

5. The semiconductor module according to claim 4, wherein an upper surface of the pad electrode is covered with the metal terminal and the insulating layer.

6. The semiconductor module according to claim 1, wherein the plurality of color conversion layers include a phosphor having a median diameter of 2 µm or less.

7. The semiconductor module according to claim 1, wherein a height of the plurality of color conversion layers from the base substrate is lower than a height of the light shielding layer from the base substrate.

8. The semiconductor module according to claim 1, wherein the light shielding layer includes a plurality of layers.

9. The semiconductor module according to claim 8, wherein the plurality of layers include a first light shielding layer and a second light shielding layer made of a material different from a material of the first light shielding layer.

10. The semiconductor module according to claim 9, wherein the second light shielding layer is disposed on the first light shielding layer, and
wherein a height of a boundary between the first light shielding layer and the second light shielding layer from the base substrate is equal to a height of a boundary between the plurality of light emitting elements and the plurality of color conversion layers from the base substrate.

11. The semiconductor module according to claim 1, further comprising:
a second dummy element formed on an upper portion of the base substrate,
wherein the second dummy element is disposed outside the plurality of light emitting elements and inside the dummy element when viewed in a top view.

12. The semiconductor module according to claim 1, wherein the light shielding layer is formed to include white resin.

13. A semiconductor module comprising:
a base substrate in which a drive circuit is formed;
a plurality of light emitting elements electrically connected to the drive circuit;
a light shielding layer disposed between the plurality of light emitting elements adjacent to each other and separating the plurality of light emitting elements;
a metal terminal provided on the base substrate and supplying electric power from outside to drive the drive circuit; and
an insulating layer provided on the base substrate and covering a part of an upper surface of the base substrate,
wherein the metal terminal penetrates the insulating layer and is in contact with a pad electrode formed on the upper surface of the base substrate,
wherein a part of the metal terminal is in contact with an upper surface of the insulating layer, and
wherein the pad electrode is embedded in the base substrate and is provided in the drive circuit formed in the base substrate.

14. The semiconductor module according to claim 13, further comprising a plurality of color conversion layers above the plurality of light emitting elements, respectively.

15. The semiconductor module according to claim 14, further comprising another light shielding layer disposed between the plurality of color conversion layers adjacent to each other.

16. A semiconductor module production method comprising:
forming a plurality of light emitting elements from a semiconductor layer grown on a growth substrate;
peeling the growth substrate from the plurality of light emitting elements by laser irradiation;
laying a light shielding layer on a base substrate, so as to cover an upper surface of the base substrate, an entirely exposed surface of each of the plurality of light emitting elements, and a metal terminal, after peeling the growth substrate; and
removing a portion of the light shielding layer on an upper surface of each of the plurality of light emitting elements and a portion of the light shielding layer on the metal terminal, after filling the light shielding layer,
wherein the plurality of light emitting elements are electrically connected to a drive circuit formed in the base substrate,
wherein the metal terminal is provided on the base substrate, and supplies electric power from outside to drive the drive circuit, and
wherein the metal terminal is in contact with a pad electrode that is embedded in the base substrate and is provided in the drive circuit formed in the base substrate.

* * * * *